(12) United States Patent
LiCausi

(10) Patent No.: US 8,669,186 B2
(45) Date of Patent: Mar. 11, 2014

(54) METHODS OF FORMING SRAM DEVICES USING SIDEWALL IMAGE TRANSFER TECHNIQUES

(75) Inventor: Nicholas V. LiCausi, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 113 days.

(21) Appl. No.: 13/359,197

(22) Filed: Jan. 26, 2012

(65) Prior Publication Data

US 2013/0196508 A1 Aug. 1, 2013

(51) Int. Cl.
*H01L 21/311* (2006.01)

(52) U.S. Cl.
USPC .......................................... 438/696

(58) Field of Classification Search
USPC ......................... 438/689, 694, 696
See application file for complete search history.

(56) References Cited

U.S. PATENT DOCUMENTS

| | | | |
|---|---|---|---|
| 4,648,937 A | 3/1987 | Ogura et al. |
| 4,689,869 A | 9/1987 | Jambotkar et al. |
| 4,808,545 A | 2/1989 | Balasubramanyam et al. |
| 5,460,991 A | 10/1995 | Hong |
| 5,885,425 A | 3/1999 | Hsieh et al. |
| 6,566,759 B1 | 5/2003 | Conrad et al. |
| 6,875,703 B1 | 4/2005 | Furukawa et al. |
| 6,949,458 B2 | 9/2005 | Conrad et al. |
| 7,265,013 B2 | 9/2007 | Furukawa et al. |
| 7,301,210 B2 * | 11/2007 | Abadeer et al. ............... 257/401 |
| 7,381,655 B2 | 6/2008 | Furukawa et al. |
| 7,439,144 B2 | 10/2008 | Doris et al. |
| 7,470,570 B2 | 12/2008 | Beintner et al. |
| 7,699,996 B2 | 4/2010 | Furukawa et al. |
| 7,763,531 B2 | 7/2010 | Abadeer et al. |
| 7,847,323 B2 | 12/2010 | Cheng et al. |
| 7,972,959 B2 | 7/2011 | Mebarki et al. |
| 7,989,355 B2 | 8/2011 | Shieh et al. |
| 7,998,357 B2 | 8/2011 | Cho et al. |
| 8,003,236 B2 | 8/2011 | Albrecht et al. |
| 8,084,310 B2 | 12/2011 | Mebarki et al. |
| 8,389,383 B1 | 3/2013 | Hopkins |

(Continued)

OTHER PUBLICATIONS

Chen et al., "Self-Aligned Triple Patterning for Continuous IC Scaling to Half-Pitch 15nm," Proc. of SPIE, vol. 7973, Mar. 22, 2011.

(Continued)

*Primary Examiner* — Roberts Culbert
(74) *Attorney, Agent, or Firm* — Amerson Law Firm, PLLC

(57) ABSTRACT

In one example, the method includes forming a hard mask layer above a semiconducting substrate, forming a patterned spacer mask layer above the hard mask layer, wherein the patterned spacer mask layer is comprised of a plurality of first spacers, second spacers and third spacers, and performing a first etching process on the hard mask layer through the patterned spacer mask layer to define a patterned hard mask layer. The method also includes performing a second etching process through the patterned hard mask layer to define a plurality of first fins, second fins and third fins in the substrate, wherein the first fins have a width that corresponds approximately to a width of the first spacers, the second fins have a width that corresponds approximately to a width of the second spacers, and the third fins have a width that corresponds approximately to a width of the third spacers.

20 Claims, 9 Drawing Sheets

(56) References Cited

U.S. PATENT DOCUMENTS

| | | |
|---|---|---|
| 2003/0115750 A1 | 6/2003 | Conrad et al. |
| 2006/0046382 A1 | 3/2006 | Yoon et al. |
| 2006/0084243 A1 | 4/2006 | Zhang et al. |
| 2007/0284669 A1 | 12/2007 | Abadeer et al. |
| 2008/0188080 A1 | 8/2008 | Furukawa et al. |
| 2008/0286971 A1 | 11/2008 | Doris et al. |
| 2008/0315746 A1 | 12/2008 | Gosain et al. |
| 2009/0090975 A1 | 4/2009 | Ong et al. |
| 2009/0101995 A1 | 4/2009 | Beintner et al. |
| 2009/0309162 A1 | 12/2009 | Baumgartner et al. |
| 2011/0014791 A1 | 1/2011 | Johnson et al. |
| 2011/0021010 A1 | 1/2011 | Cheng et al. |
| 2011/0111596 A1 | 5/2011 | Kanakasabapathy |
| 2011/0113393 A1 | 5/2011 | Sezginer |
| 2011/0117743 A1 | 5/2011 | Bai et al. |
| 2012/0122315 A1 | 5/2012 | Booth, Jr. et al. |
| 2012/0258587 A1 | 10/2012 | Kub et al. |

OTHER PUBLICATIONS

Chen et al., "Mandrel and Spacer Engineering Based Self-aligned Triple Patterning," Proc. of SPIE, vol. 8328, Apr. 16, 2012.

Chen et al., "Self-Aligned Triple Patterning to Extend Optical Lithography for 1x Patterning," Presentation from International Symposium on Lithography Extensions, Oct. 21, 2010.

Mebarki et al., "Innovative Self-Aligned Triple Patterning for 1x half pitch using Single 'Spacer Deposition-Spacer Etch step," Proc. of SPIE, vol. 7973, Mar. 22, 2011.

Zimmerman, "Double patterning lithography: double the trouble or double the fun?," SPIE Newsroom, 2009.

Sematech Panel Discussion downloaded from URL <http://www.sematech.org/meetings/archives/litho/8065/pres/D3%20Panel%20Discussion.pdf> on Feb. 20, 2013.

Medeiros D., "Lithograph on the Edge," 6th International Symposium on Immersion Lithography Extensions, Praque Czech Republic, Oct. 20, 2009.

\* cited by examiner

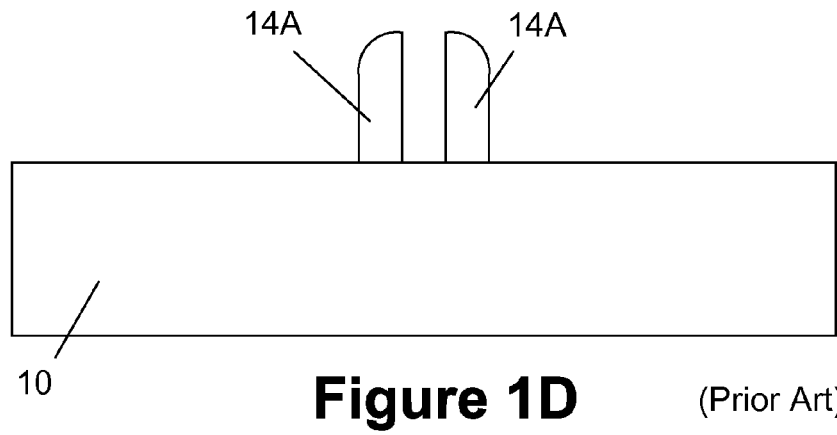
Figure 1D (Prior Art)
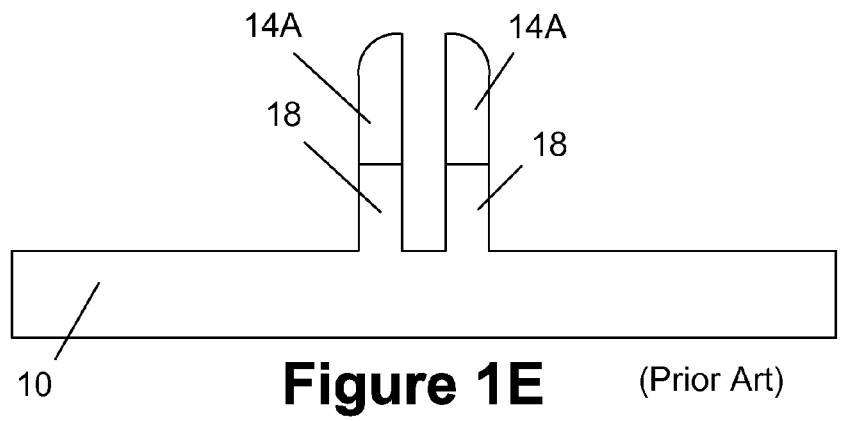
Figure 1E (Prior Art)
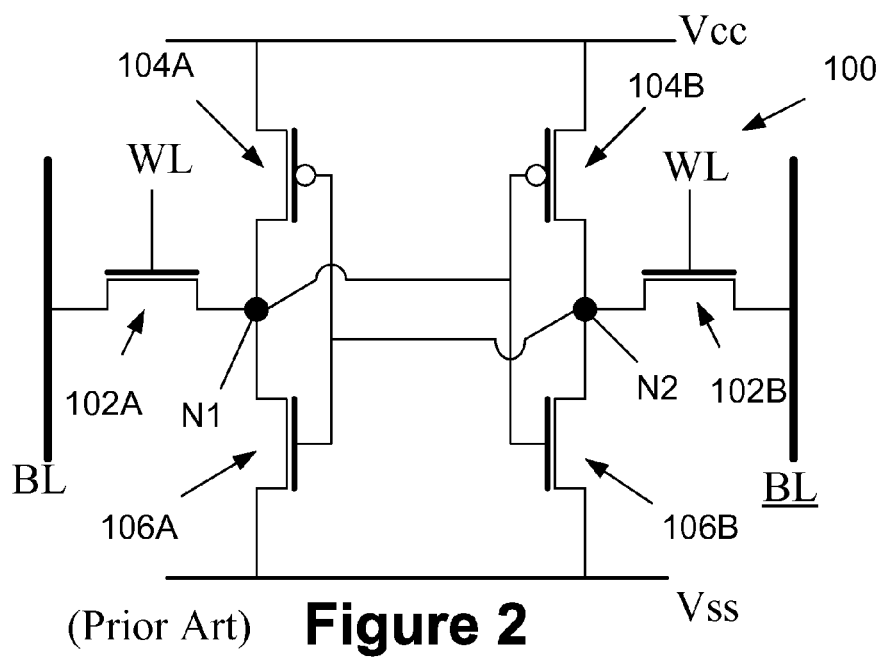
(Prior Art) Figure 2

METHODS OF FORMING SRAM DEVICES USING SIDEWALL IMAGE TRANSFER TECHNIQUES

BACKGROUND OF THE INVENTION

1. Field of the Invention

Generally, the present disclosure relates to the manufacturing of sophisticated semiconductor devices, and, more specifically, to various methods of forming SRAM (Static Random Access Memory) devices using sidewall image transfer techniques.

2. Description of the Related Art

The fabrication of advanced integrated circuits, such as CPU's, storage devices, ASIC's (application specific integrated circuits) and the like, requires the formation of a large number of circuit elements, such as transistors, resistors, capacitors, etc., in a given chip area according to a specified circuit layout. A field effect transistor (FET) is a planar device, irrespective of whether an NMOS transistor or a PMOS transistor is considered, that typically includes doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

In contrast to a FET, which has a planar structure, there are so-called 3D devices, such as FinFET devices, which are 3-dimensional structures. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

Numerous processing operations are performed in a very detailed sequence, or process flow, to form such integrated circuit devices, e.g., deposition processes, etching processes, heating processes, masking operations, etc. In general, the formation of integrated circuit devices involves, among other things, the formation of various layers of material and patterning or removing portions of those layers of material to define a desired structure, such as a gate electrode, a sidewall spacer, etc. Device designers have been very successful in improving the electrical performance capabilities of transistor devices, primarily by reducing the size of or "scaling" various components of the transistor, such as the gate length of the transistors. In fact, device dimension on modern day transistors have been reduced to the point where direct patterning of such features is very difficult using existing 193 nm based photolithography tools and technology. Thus, device designers have employed various techniques to pattern very small features. One such technique is generally known as a sidewall image transfer technique.

FIGS. 1A-1E depict one illustrative example of a prior art sidewall image transfer technique. As shown in FIG. 1A, a mandrel 12 is formed above a structure 10, such as a semiconducting substrate. The mandrel 12 may be made of a variety of materials, e.g., amorphous silicon, polysilicon, etc. The size of the mandrel 12 may vary depending upon the particular application. The mandrel 12 may be formed be depositing and patterning a layer of mandrel material using known deposition, photolithography and etching tools and techniques. Next, as shown in FIG. 1B, a layer of spacer material 14 is conformably deposited above the mandrel 12 and the structure 10. The layer of spacer material 14 may be comprised of a variety of materials, such as, for example, silicon nitride, silicon dioxide, etc. As reflected in FIG. 1C, an anisotropic etching process is performed to define spacers 14A adjacent the mandrel 12. Then as shown in FIG. 1D, the mandrel 12 is removed by performing a selective etching process that leaves the spacers 14A to act as masks in a subsequent etching process that defines features 18 in the structure 10, as depicted in FIG. 1E.

Semiconductor memory devices are in widespread use in many modern integrated circuit devices and in many consumer products. In general, memory devices are the means by which electrical information is stored. There are many types of memory devices, SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Special read/write circuitry is used to access the memory device to store digital information on such a memory device and to determine whether or not a charge is presently stored in the memory device. These program/erase cycles ("P/E cycles") typically occur millions of times for a single memory device over its effective lifetime.

As shown in FIG. 2, a typical 6 T (six transistors) SRAM memory cell 100 includes two N-FinFET pass gate transistors 102A/B, two P-FinFET pull-up transistors 104A/B, and two N-FinFET pull-down transistors 106A/B. Each of the P-FinFET pull-up transistors 104A/B has its gate connected to the gate of a corresponding N-FinFET pull-down transistor 106A/B. The drains of the P-FinFET pull-up transistors 104A/B are connected to the drains of corresponding N-FinFET pull-down transistors 106A/B to form inverters having the conventional configuration. The sources of the P-FinFET pull-up transistors 104A/B are connected to a high reference potential, typically $V_{CC}$, and the sources of the N-FinFET pull-down transistors 106A/B are connected to a lower reference potential, typically $V_{SS}$ or ground. The gates of the P-FinFET pull-up transistor 104A and the N-FinFET pull-down transistor 106A, which make up one inverter, are connected to the drains of the transistors 104B, 106B of the other inverter. Similarly, the gates of the P-FinFET pull-up transistor 104B and the N-FinFET pull-down transistor 106B, which make up the other inverter, are connected to the drains of the transistors 104A, 106A. Hence, the potential present on the drains of the transistors 104A, 106A (node N1) of the first inverter is applied to the gates of transistors 104B, 106B of the second inverter and the charge serves to keep the second inverter in an ON or OFF state. The logically opposite potential is present on the drains of the transistors 104B, 106B (node N2) of the second inverter and on the gates of the transistors 104A, 106A of the first inverter, keeping the first inverter in the complementary OFF or ON state relative to the second inverter. Thus, the latch of the illustrated SRAM cell 100 has two stable states: a first state with a predefined potential present on charge storage node N1 and a low potential on charge storage node N2; and a second state with a low potential on charge storage node N1 and the predefined potential on charge storage node N2. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state.

Data is read out of the conventional SRAM cell 100 in a non-destructive manner by selectively coupling each charge storage node (N1, N2) to a corresponding one of a pair of complementary bit lines (BL, BL). The selective coupling is accomplished by the aforementioned pass gate transistors 102A/B, where each pass gate transistor is connected between one of the charge storage nodes (N1, N2) and one of the complementary bit lines (BL, BL). Word line signals are provided to the gates of the pass gate transistors 102A/B to switch the pass gate transistors ON during data read operations. Charge flows through the ON pass gate transistors to or from the charge storage nodes (N1, N2), discharging one of the bit lines and charging the other of the bit lines. The voltage changes on the bit lines are sensed by a differential amplifier (not shown).

It appears that, for the foreseeable future, SRAM devices will continue to enjoy widespread use in integrated circuit products. Semiconductor manufacturers will thus continue to try to develop more efficient and effective methods of making SRAM devices. The present disclosure is directed to various methods of forming SRAM devices using sidewall image transfer techniques.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming SRAM (Static Random Access Memory) devices using sidewall image transfer techniques. In one example, the method includes forming a hard mask layer above a semiconducting substrate, forming a patterned spacer mask layer above the hard mask layer, wherein the patterned spacer mask layer is comprised of a plurality of first spacers, a plurality of second spacers and a plurality of third spacers, and performing a first etching process on the hard mask layer through the patterned spacer mask layer to thereby define a patterned hard mask layer. The method includes the additional step of performing a second etching process on the substrate through the patterned hard mask layer to thereby define a plurality of first fins, second fins and third fins in the substrate, wherein the first fins have a first width that corresponds approximately to a width of the first spacers, the second fins have a second width that corresponds approximately to a width of the second spacers, and said third fins have a third width that corresponds approximately to a width of the third spacers.

BRIEF DESCRIPTION OF THE DRAWINGS

The disclosure may be understood by reference to the following description taken in conjunction with the accompanying drawings, in which like reference numerals identify like elements, and in which:

FIGS. 1A-1E depict one illustrative example of a prior art sidewall image transfer technique;

FIG. 2 is an electrical schematic of an illustrative six-transistor prior art SRAM device;

Figure 1A:
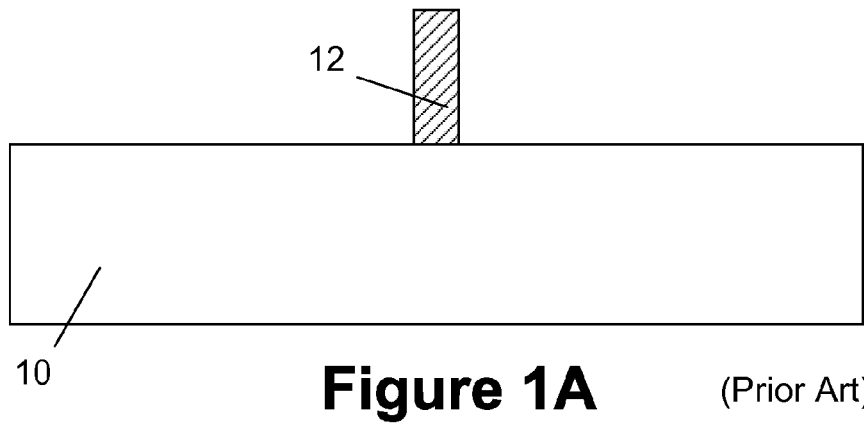
Figure 1B:
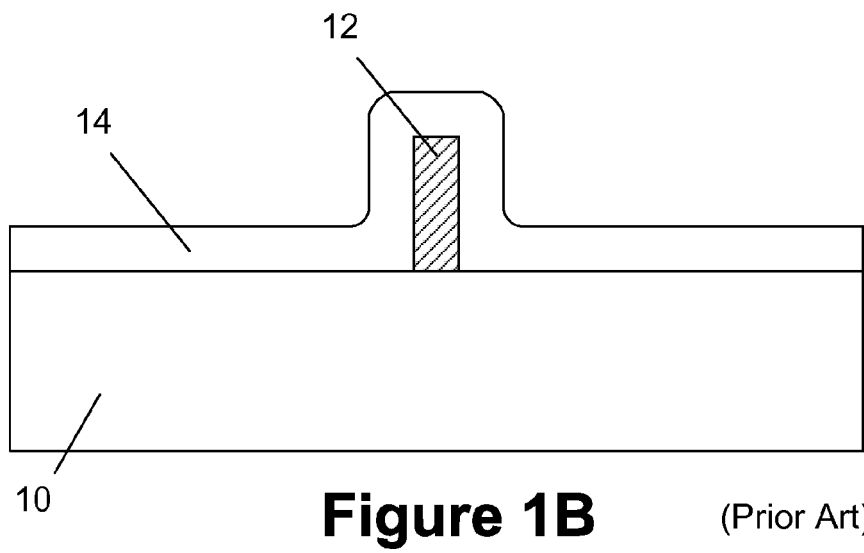
Figure 1C:
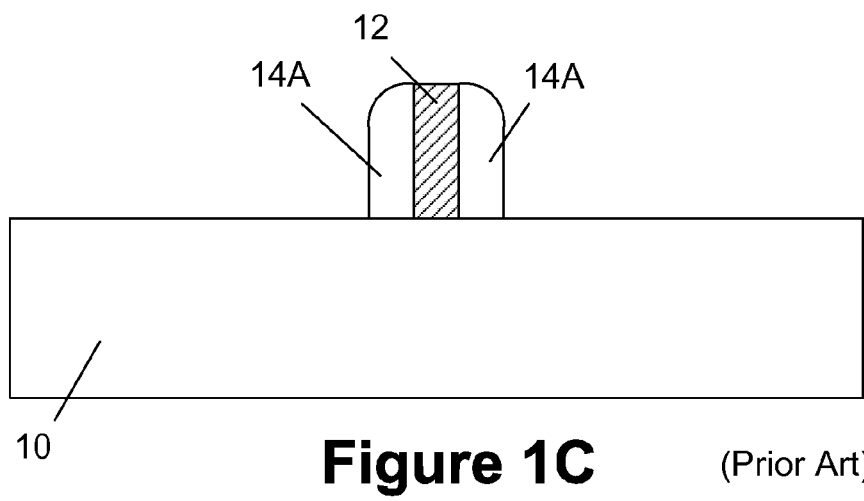

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods of forming SRAM devices using sidewall image transfer techniques. With reference to the attached drawings various illustrative embodiments of the methods and devices disclosed herein will now be described in more detail.

Figure 3:
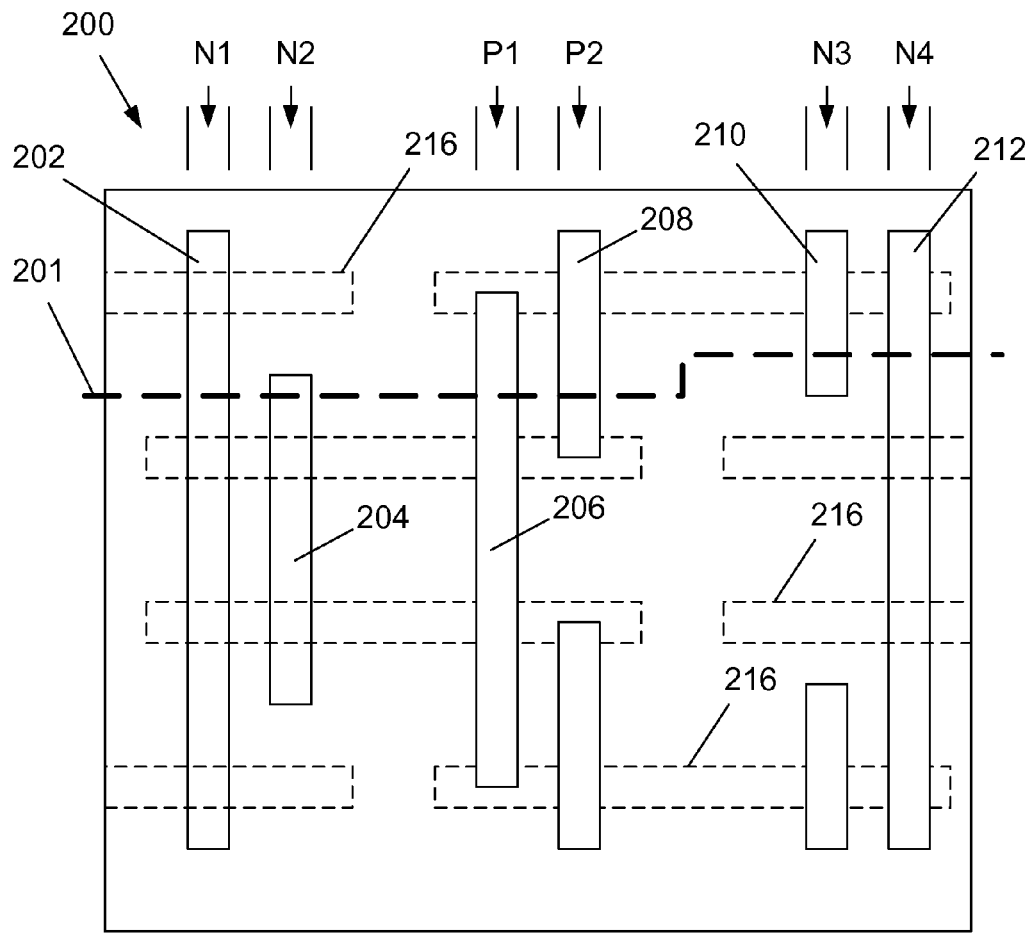
FIG. 3 is a plan view of one illustrative embodiment of an SRAM device disclosed herein.
Figure 4A:
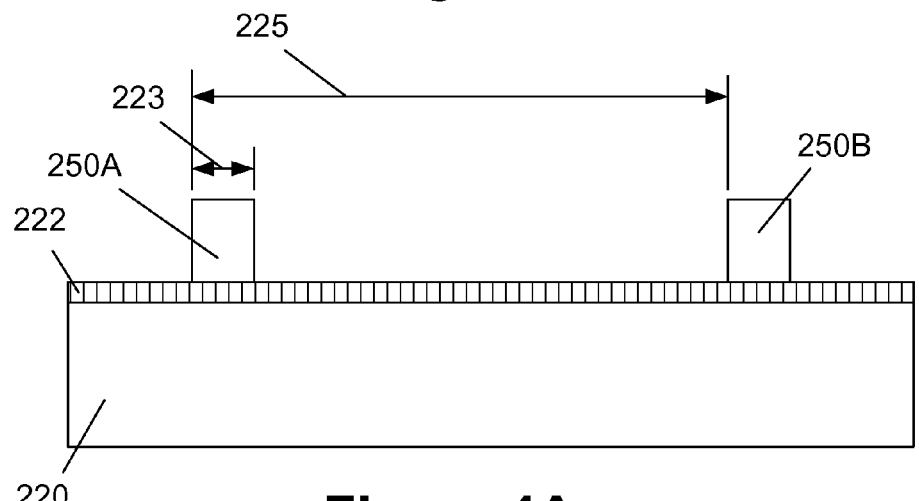
FIGS. 4A-4S depict various illustrative methods disclosed herein of forming SRAM devices using sidewall image transfer techniques.

FIG. 3 is a plan view of a schematic layout of one illustrative embodiment of an illustrative SRAM device 200 that may be manufactured using the techniques disclosed herein. The SRAM device 200 includes four illustrative N-FinFET transistors (N1-N4) and two P-FinFET transistors (P1-P2). The SRAM device 200 includes a plurality of fins 202, 204, 206, 208, 210 and 212 for the transistors N1, N2, P1, P2, N3 and N4, respectively. Also depicted in dashed lines are a plurality of gate structures 216 that will ultimately be formed across the fins shown in FIG. 3. FIGS. 4A-4S are cross-sectional views of the SRAM device 200 taken along the dashed line 201 shown in FIG. 3.

FIGS. 4A-4S depict various methods disclosed herein for SRAM devices that are comprised of a plurality of FinFET transistors wherein the fins for such FinFET devices are formed using sidewall image transfer techniques. As shown in FIG. 4A, a hard mask layer 222 is formed above a semiconducting substrate 220 and a plurality of first mandrels 250A, 250B are formed above the hard mask layer 222. The semiconducting substrate 220 may be made of a variety of materials, such as silicon, gallium arsenide, etc., and it may have either a bulk configuration or a so-called silicon-on-insulator (SOI) substrate. The hard mask layer 222 may be comprised of a variety of materials, such as, for example, silicon nitride, silicon oxynitride, etc. The hard mask layer 222 may be formed by performing a chemical vapor deposition (CVD) process, and it may have a thickness that varies depending upon the particular application, e.g., 20-50 nm, and the details of the SRAM device, as discussed more fully below. The first mandrels 250A, 250B may be made of a variety of materials, e.g., amorphous silicon, polysilicon, silicon dioxide, etc. The first mandrels 250A, 250B may be formed be depositing and patterning a layer of mandrel material using known deposition, photolithography and etching tools and techniques. The methods disclosed herein involve, among other things, the formation of various mandrels and spacers. In general, the mandrels and spacers should be made of materials that may be selectively etched with respect to one another. In one illustrative example, the pitch 225 between the two depicted first mandrels 250A, 250B may be about 10 times the minimum pitch of the final SRAM structure. This will typically be on the order of the limits of conventional lithography. The width 223 of each of the first mandrels 250A, 250B may be about 90-180 nm.

Figure 4B:
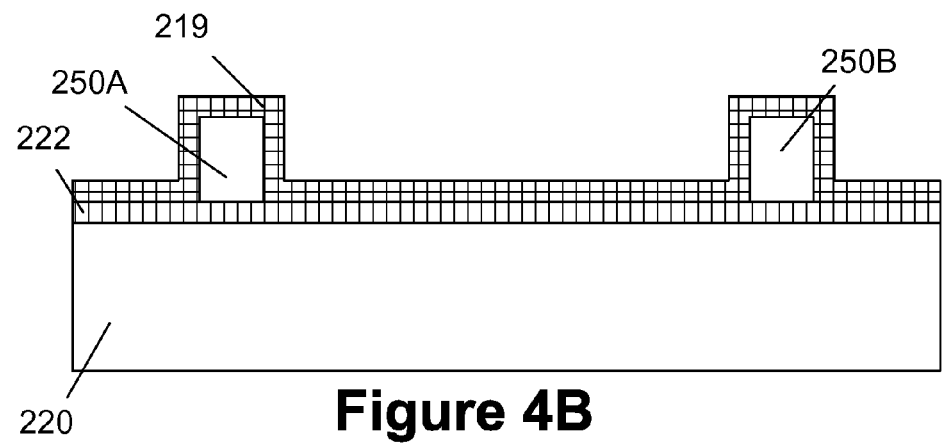

Next as shown in FIG. 4B, a first spacer material layer 219 is conformably deposited above the first mandrels 250A, 250B and the structure 220. The first spacer material layer 219 may be comprised of a variety of materials, such as, for example, silicon nitride, silicon dioxide, etc. The thickness of the first spacer material layer 219 may vary depending upon the size of the features to be formed in the structure 220, as described more fully below. In one illustrative embodiment, the first spacer material layer 219 may be a layer of silicon nitride and it may have a thickness of about 5-50 nm.

Figure 4C:
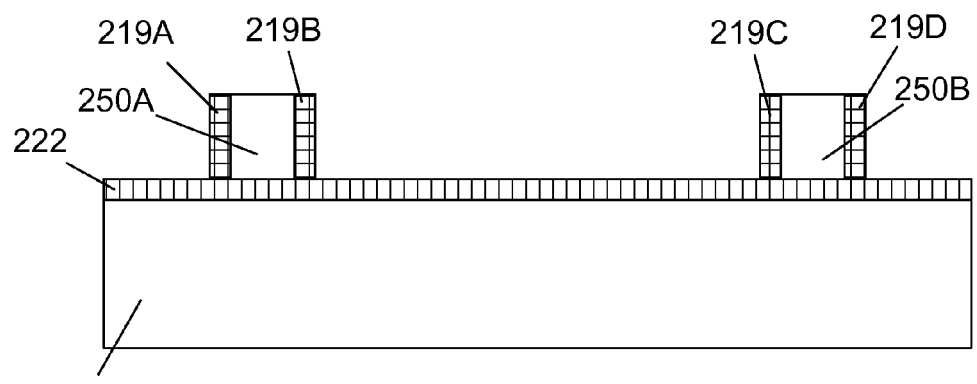

Next, as shown in FIG. 4C, an anisotropic etching process is performed on the first spacer material layer 219 to define a plurality of first spacers 219A-D adjacent the first mandrels 250A, 250B. In one illustrative embodiment, the width of each of the first spacers 219A-D may be about 5-50 nm.

Figure 4D:
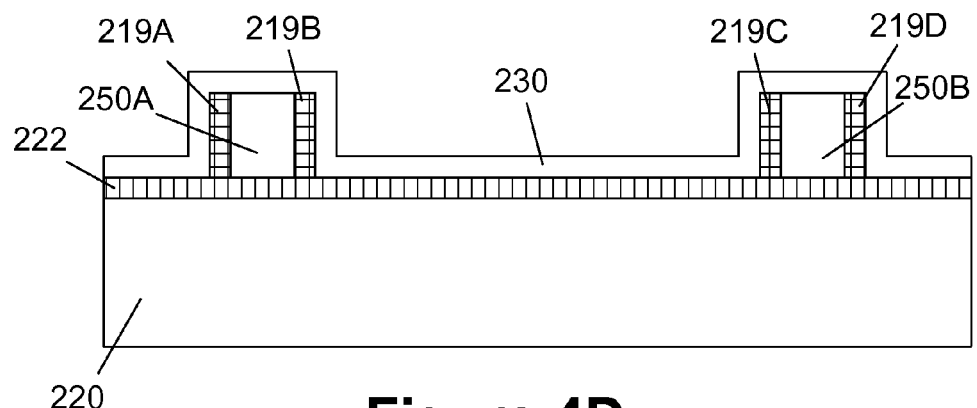

Then, as shown in FIG. 4D, a second mandrel material layer 230 is conformably deposited above the device. The second mandrel material layer 230 may be comprised of a variety of materials, such as, for example, amorphous silicon, polysilicon, silicon dioxide, etc. The thickness of the second mandrel material layer 230 may vary depending upon the size of the features to be formed in the structure 220, as described more fully below. In one illustrative embodiment, the thickness of the second mandrel material layer 230 may be about 25-50 nm. The second mandrel material layer 230 may be made of the same material as the first mandrels 250A, 250B, although that is not required in all applications.

Figure 4E:
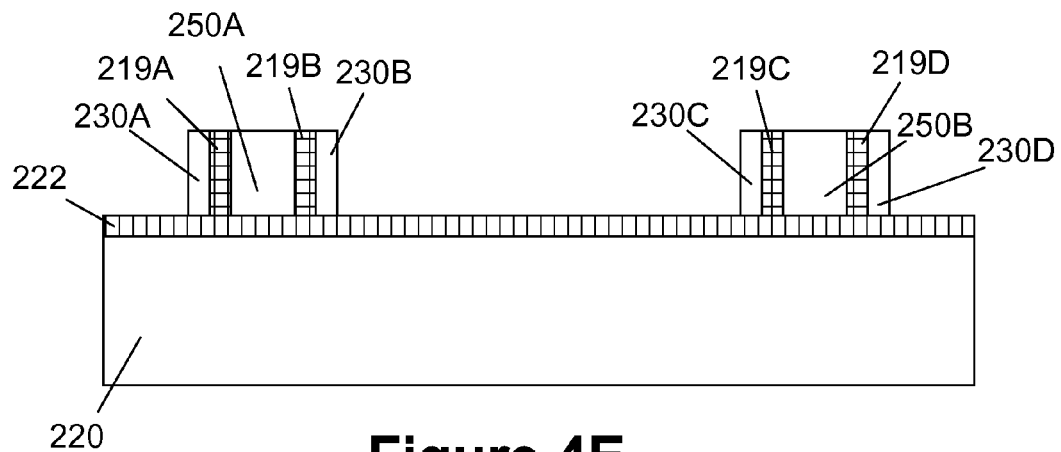

Next, as shown in FIG. 4E, an anisotropic etching process is performed on the second mandrel material layer 230 to define a plurality of second mandrels 230A-D adjacent the first spacers 219A-D. The width of the second mandrels 230A-D may be the same as or different than the width of the first mandrels 250A, 250B, i.e., the second mandrels 230A-D may be narrower than the width of the first mandrels 250A, 250B, as shown in FIG. 4E. In one illustrative embodiment, the width of the second mandrels 230A-D may be about 20-50 nm.

Figure 4F:
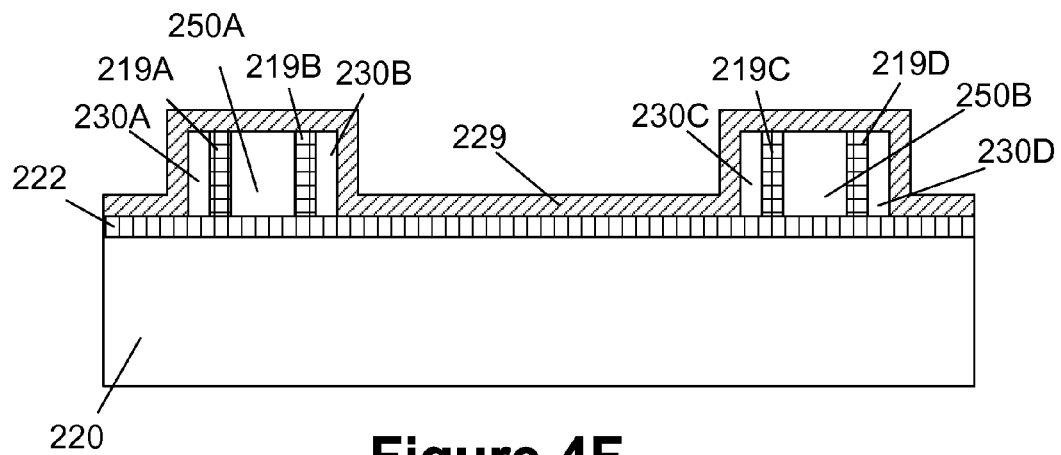

Next as shown in FIG. 4F, a second spacer material layer 229 is conformably deposited above the structure 220. The second spacer material layer 229 may be comprised of a variety of materials, such as, for example, silicon nitride, silicon dioxide, etc. The thickness of the second spacer material layer 229 may vary depending upon the size of the features to be formed in the structure 220, as described more fully below. In one illustrative embodiment, the second spacer material layer 229 may be a layer of silicon nitride and it may have a thickness of about 5-50 nm. The second spacer material layer 229 may be made of the same or different material as that used for the first spacer material layer 219. The thickness of the second spacer material layer 229 may be the same as or different from the thickness of the first spacer material layer 219.

Figure 4G:
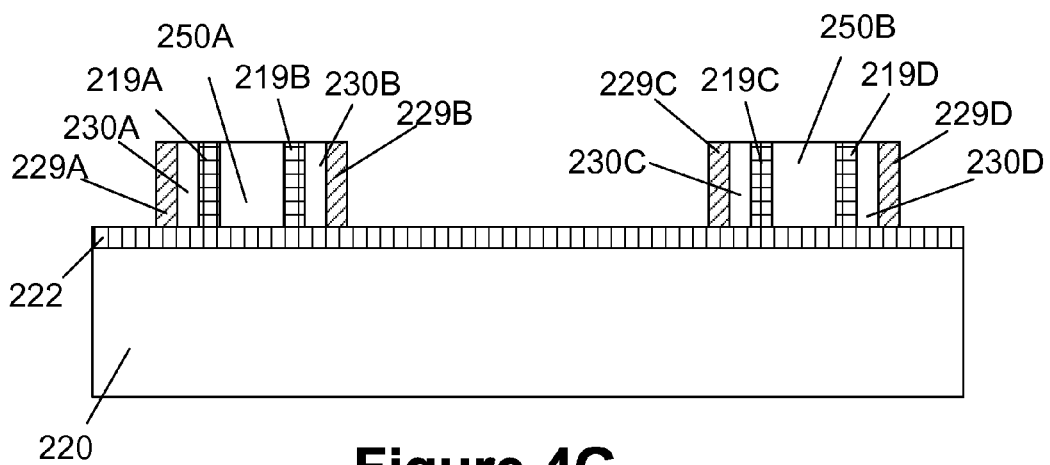

Next, as shown in FIG. 4G, an anisotropic etching process is performed on the second spacer material layer 229 to define a plurality of second spacers 229A-D. In one illustrative embodiment, the width of each of the second spacers 229A-D may be about 5-50 nm.

Figure 4H:
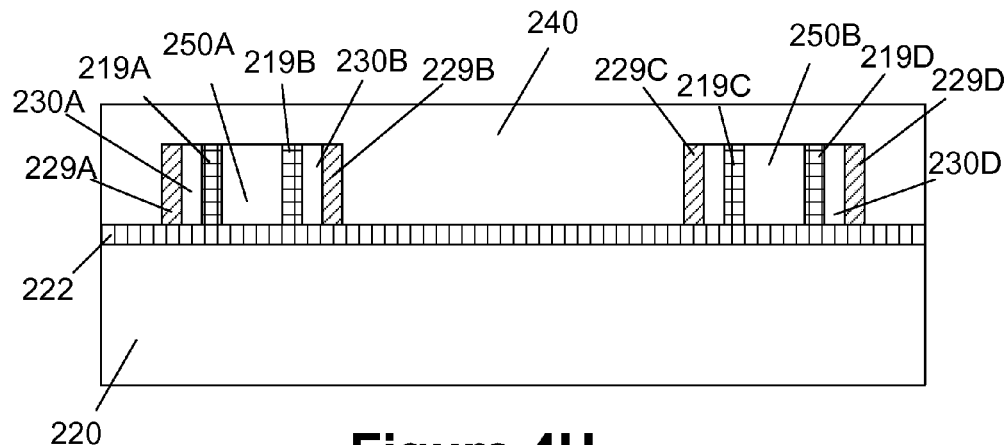
Figure 4I:
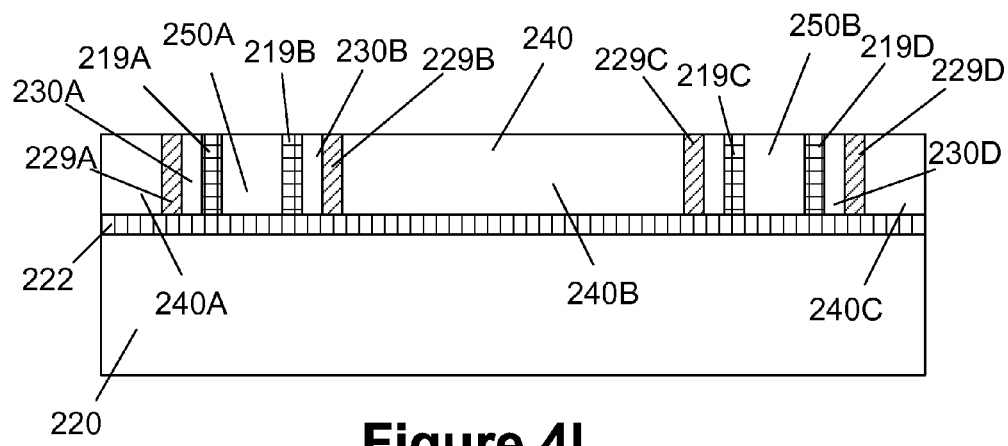
Figure 4J:
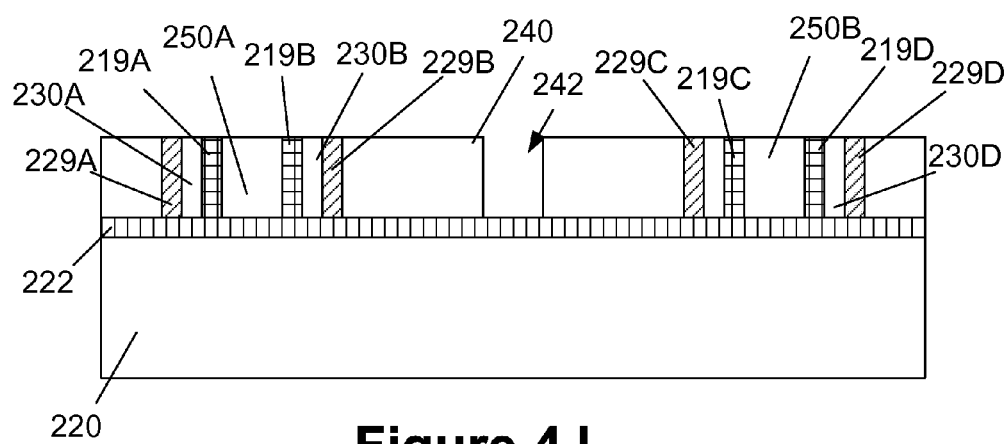

Then, as shown in FIG. 4H, a third mandrel material layer 240 is blanket-deposited above the device such that it overfills the spaces between the structures shown in FIG. 4G. The third mandrel material layer 240 may be comprised of a variety of materials, such as, for example, amorphous silicon, polysilicon, silicon dioxide, etc. In one illustrative embodiment, the thickness of the second mandrel material layer 230 may be made of silicon dioxide. The third mandrel material layer 240 may be made of the same material as the first mandrels 250A, 250B, and/or the second mandrels 230A-230D, although that is not required in all applications, or they may all be made of different materials. As shown in FIG. 4I, a chemical mechanical polishing (CMP) process is performed to planarize the upper surface of the third mandrel material layer 240 and thereby define a plurality of third mandrels 240A-C. Thereafter, as shown in FIG. 4J, an opening 242 is formed in the third mandrel 240B by performing an etching process through a patterned mask layer (not shown) using known photolithography and etching techniques. In one illustrative embodiment, the opening 242 may have a width of about 40-120 nm.

Figure 4K:
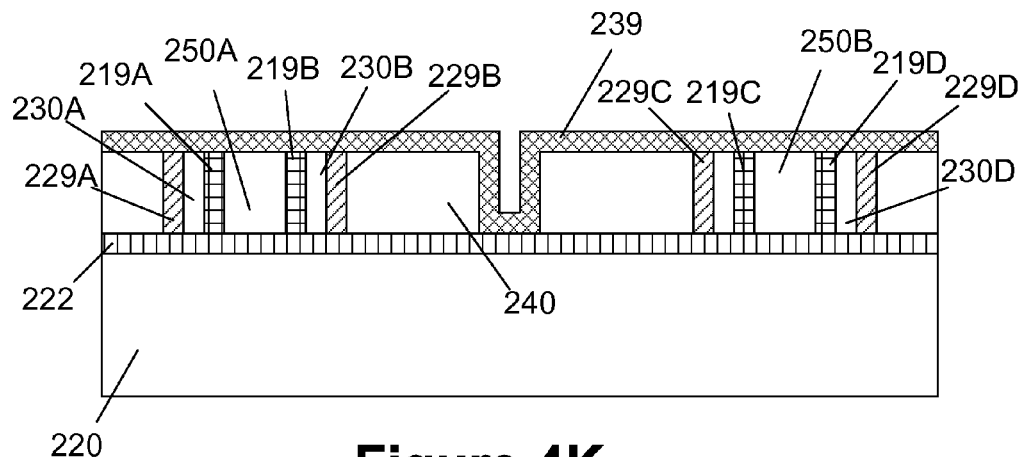

Next as shown in FIG. 4K, a third spacer material layer 239 is conformably deposited above the structure 220. The third spacer material layer 239 may be comprised of a variety of materials, such as, for example, silicon nitride, silicon dioxide, etc. The thickness of the third spacer material layer 239 may vary depending upon the size of the features to be formed in the structure 220, as described more fully below. In one illustrative embodiment, the third spacer material layer 239 may be a layer of silicon nitride and it may have a thickness of about 5-50 nm. The third spacer material layer 239 may be made of the same or different material as that used for the first spacer material layer 219 and/or the second spacer material layer 229. The thickness of the third spacer material layer 239 may be the same as or different from the thickness of the first spacer material layer 219 and/or the second spacer material layer 229.

Figure 4L:
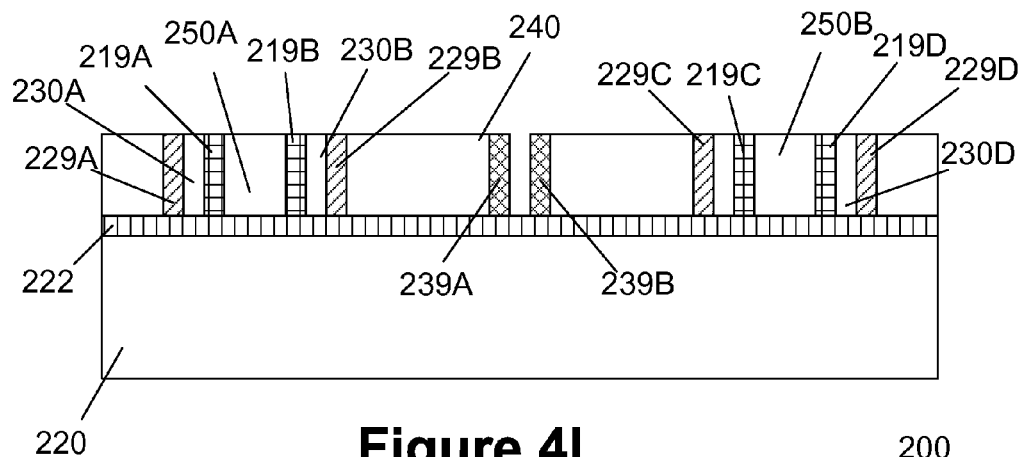

Next, as shown in FIG. 4L, an anisotropic etching process is performed on the third spacer material layer 239 to define a plurality of third spacers 239A-B. In one illustrative embodiment, the width of each of the third spacers 239A-B may be about 5-50 nm.

Figure 4M:
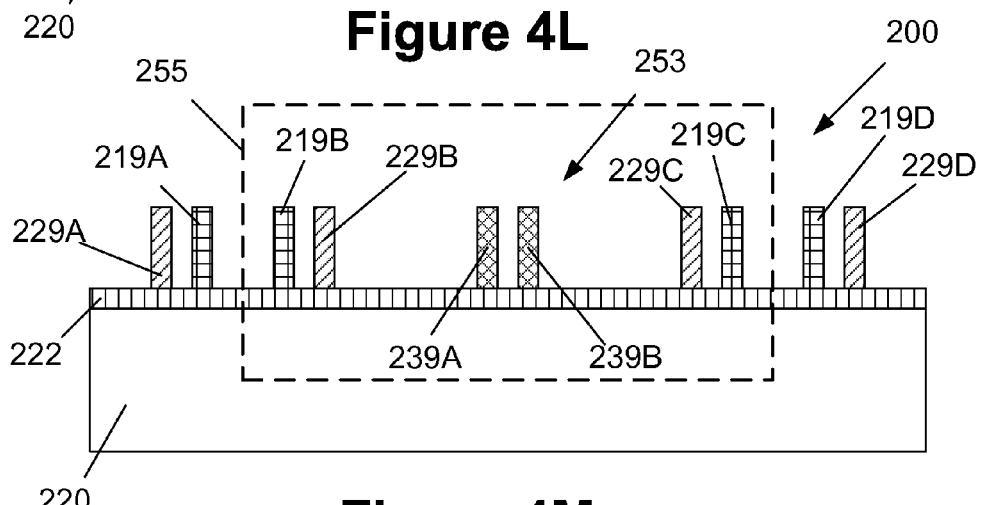

Then, as shown in FIG. 4M, one or more etching processes are performed to selectively remove first mandrels 250A, 250B, the second mandrels 230A-D, and the third mandrels 240A-C. The dashed line 255 is a simplistic outline of the region where the SRAM device 200 will be formed and generally shows that the spacers 219B, 229B, 239A, 239B, 229C and 219C will be employed in forming the illustrative six-transistor SRAM device 200 described previously. That is, the spacers 219B, 229B, 239A, 239B, 229C and 219C collectively define a patterned spacer mask layer 253 that will be employed in forming the SRAM device 200. As will be appreciated by those skilled in the art after a complete reading of the present application, other SRAM devices (not shown) may be formed in the substrate 220 in regions that are on opposite sides of the dashed line 255. The various spacers 229A, 219A, 219D and 229D may be employed in forming such other SRAM devices.

Figure 4N:
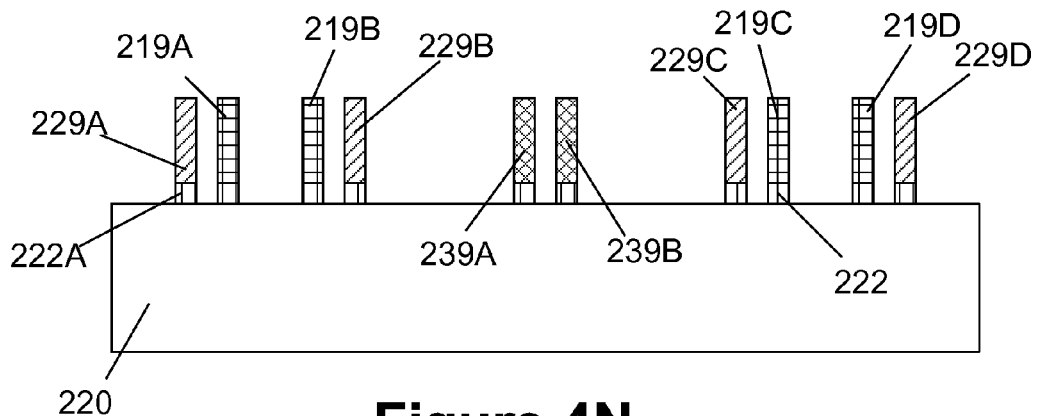

Then, as shown in FIG. 4N, the various spacers shown in FIG. 4M are used as an etch mask during an etching process that is performed on the hard mask layer 222. This etching process results in the definition of a patterned hard mask layer 222A.

Figure 4O:
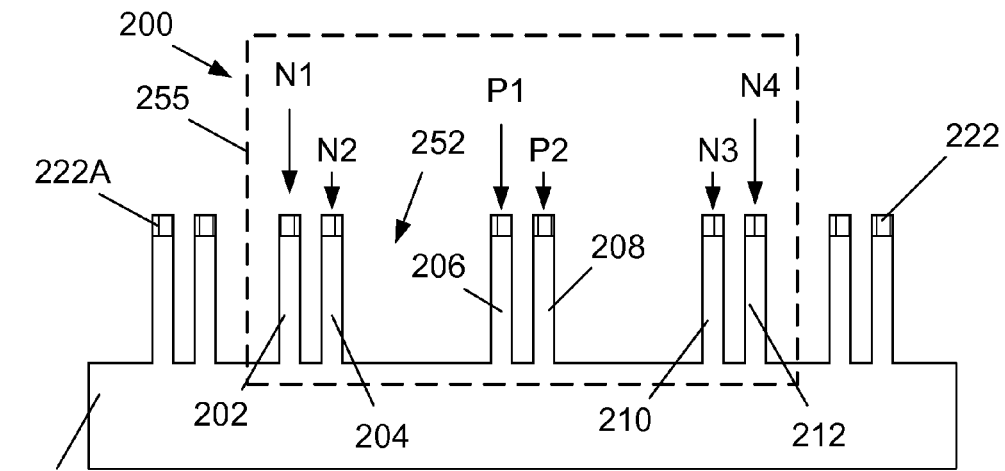

FIG. 4O reflects the device after an etching process, either a wet or dry etching process, has been performed on the substrate 220 through the patterned hard mask layer 222A to define a plurality of trenches 252 in the substrate 220. The trenches 252 define a plurality of fins 202, 204, 206, 208, 210 and 212 for the FinFET transistors N1, N2, P1, P2, N3 and N4, respectively, for the SRAM device 200.

Figure 4P:
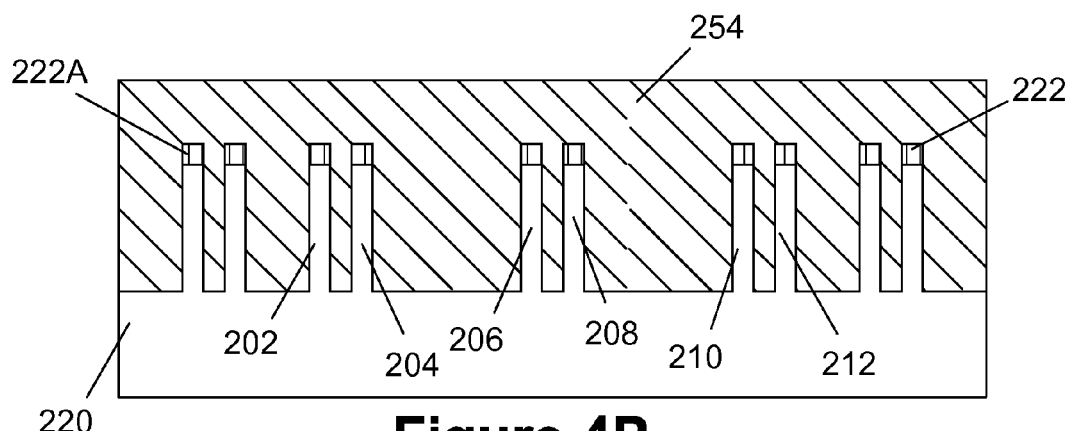
Figure 4Q:
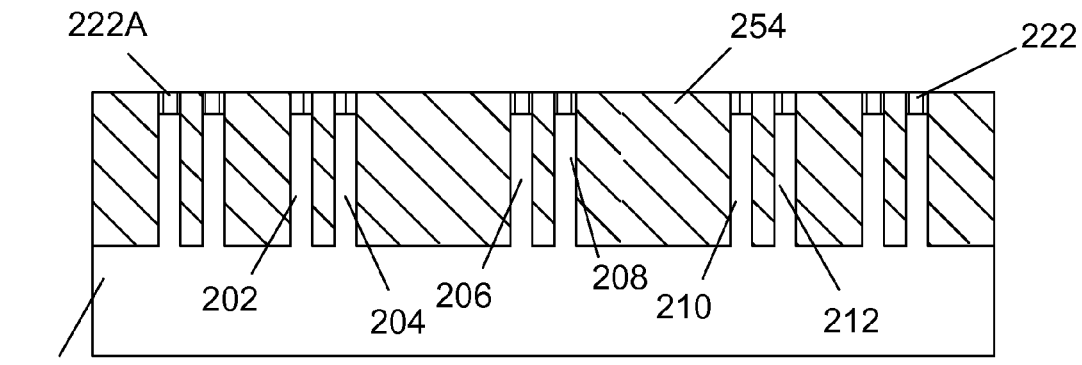
Figure 4R:
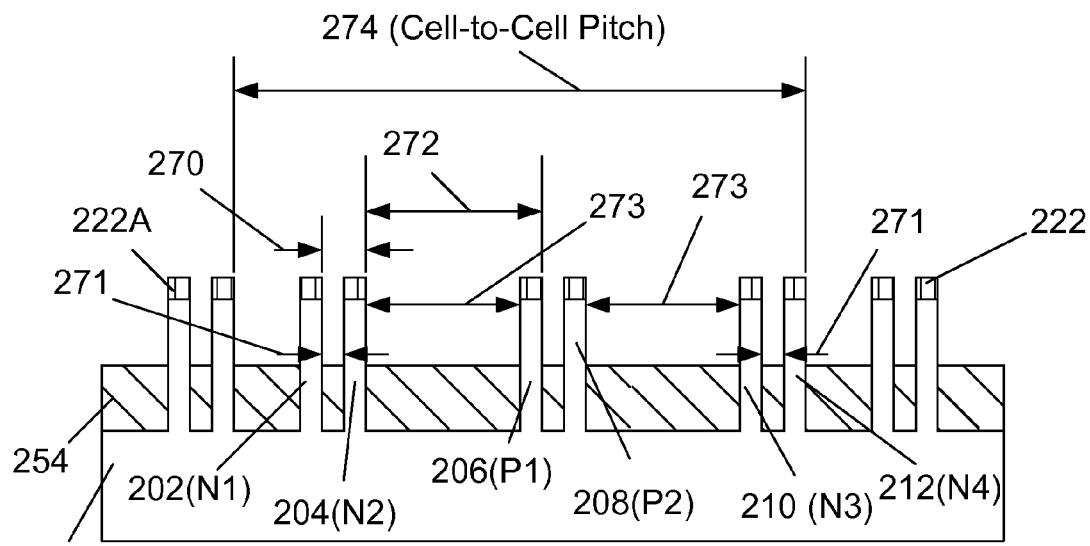
Figure 4S:
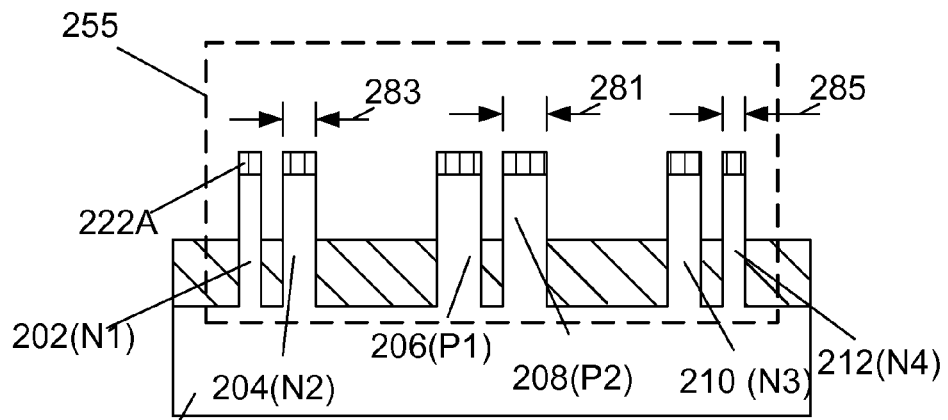

After this point, traditional fabrication techniques may be employed to complete the fabrication of the SRAM device. For example, as shown in FIG. 4P, a layer of insulating material 254 is blanket-deposited so as to over-fill the trenches 252. The layer of insulating material 254 may be comprised of a variety of different materials, e.g., silicon dioxide. FIG. 4Q depicts the device after a CMP process has been performed on the layer of insulating material 254 using the patterned hard mask layer 222A as a polish-stop layer. Then, as shown in FIG. 4R, an etching process is performed on the layer of insulating material 254 to reduce its thickness and thereby establish the final height of the fins for the SRAM device 200. Using the methods disclosed herein, the cell-to-cell pitch 274 between adjacent SRAM devices may be about 300-600 nm. Additionally, in the illustrative example depicted herein, the pitch 270 between adjacent transistors in the SRAM device 200 may be about 25-80 nm.

As will be appreciated by those skilled in the art after a complete reading of the present application, the methods disclosed herein will provide device designers with great flexibility as it relates to the manufacturing of SRAM devices. In the example depicted in FIGS. 4A-4R, the first spacers, second spacers and third spacers all have the same approximate thickness. However, using the methods disclosed herein, the thicknesses of the first spacers, second spacers and third spacers may be different to achieve different design purposes, e.g., it may be desirable that the fins of the two P-FinFET transistors (206 and 208) be thicker than the fins of the four N-FinFET transistors (202, 204, 210 and 212). For example, FIG. 4S depicts an illustrative SRAM device wherein the fins for the various transistors have differing widths. More specifically, in this depicted example, the width 281 of the fins 206 (for transistor P1) and 208 (for transistor P2) are twice as wide as the width 285 of the fins 202 (for transistor N1) and 212 (for transistor N4). The illustrative fins 204 (for the transistor N2) and 210 (for the transistor N3) have a width 283 that is about 1.5 times the width 285 of the fins 202 (for transistor N1) and 212 (for transistor N4). Using the methods disclosed herein, the width of the first spacers 219B, 219C determines the width of the fins 202, 212 for the N-FinFET devices N1 and N4, respectively; the width of the second spacers 229B, 229C determines the width of the fins 204, 210 for the N-FinFET devices N2 and N3; and the width of the third spacers 239A, 239B determines the width of the fins 206, 208 for the P-FinFET devices P1 and P2, respectively. By controlling the thickness of these various spacers, the thickness of the various fins may be controlled as desired to enhance device performance. The width of the second mandrel 230B establishes the spacing between the fins 202, 204, of the N-FinFET devices N1 and N2, while the width of the second mandrel 230C establishes the spacing between the fins 210, 212 of the N-FinFET devices N3 and N4. The methods disclosed herein enable device designers to finely tune the design of SRAM devices if desired. For example, the fin width of the P-FinFET devices and N-FinFET devices can be varied, thereby enabling the tailoring of threshold voltage values for such devices on an individual basis, which may lead to better threshold voltage matching. The methods disclosed herein also provide the capability to precisely control the spacing between transistor banks on an SRAM device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an SRAM device, comprising:
    forming a hard mask layer above a semiconducting substrate;
    forming a patterned spacer mask layer above the hard mask layer, wherein forming said patterned spacer mask layer comprises:
        forming a plurality of first spacers;
        after forming said plurality of first spacers, forming a plurality of second spacers; and
        after forming said plurality of second spacers, forming a plurality of third spacers;
    performing a first etching process on said hard mask layer through said patterned spacer mask layer to thereby define a patterned hard mask layer;
    performing a second etching process on said substrate through said patterned hard mask layer to thereby define a plurality of first fins in said substrate, a plurality of second fins in said substrate and a plurality of third fins in said substrate, wherein said first fins have a first width that corresponds approximately to a width of said first spacers, said second fins have a second width that corresponds approximately to a width of said second spacers, and said third fins have a third width that corresponds approximately to a width of said third spacers.

2. The method of claim 1, wherein said first, second and third widths are the same.

3. The method of claim 1, wherein said first, second and third widths are all different from one another.

4. The method of claim 1, wherein two of said first, second and third widths are the same while the other one of said first, second and third widths is different from said two of said first, second and third widths.

5. The method of claim 1, wherein said first, second and third spacers are all comprised of the same material.

6. The method of claim 1, wherein each of said first, second and third spacers are comprised of a different material.

7. The method of claim 1, wherein said semiconducting substrate is comprised of silicon.

8. The method of claim 1, further comprising removing said patterned spacer mask layer prior to performing said second etching process.

9. The method of claim 1, wherein forming said pluralities of first, second, and third spacers comprises:
 depositing a layer of a first spacer material;
 performing a first anisotropic etching process on said layer of first spacer material to thereby define said plurality of first spacers;
 after forming said plurality of first spacers, depositing a layer of a second spacer material;
 performing a second anisotropic etching process on said layer of second spacer material to thereby define said plurality of second spacers;
 after forming said plurality of second spacers, depositing a layer of a third spacer material; and
 performing a third anisotropic etching process on said layer of third spacer material to thereby define said plurality of third spacers.

10. The method of claim 1, wherein forming said pluralities of first, second, and third spacers comprises:
 forming a plurality of first mandrels;
 forming said plurality of first spacers adjacent to sidewalls of said first mandrels;
 after forming said plurality of first mandrels, forming a plurality of second mandrels;
 forming said plurality of second spacers adjacent to sidewalls of said second mandrels;
 after forming said plurality of second mandrels, forming a plurality of third mandrels; and
 forming said plurality of third spacers adjacent to sidewalls of said third mandrels.

11. The method of claim 1, wherein forming said pluralities of first, second, and third spacers comprises:
 forming a plurality of first mandrels;
 forming said plurality of first spacers adjacent to sidewalls of said first mandrels;
 after forming said plurality of first spacers, forming a plurality of second mandrels;
 forming said plurality of second spacers adjacent to sidewalls of said second mandrels;
 after forming said plurality of second spacers, forming a plurality of third mandrels; and
 forming said plurality of third spacers adjacent to sidewalls of said third mandrels.

12. The method of claim 1, wherein each of said first spacers comprise a first material, each of said second spacers comprise a second material, and each of said third spacers comprise a third material, said first material being different from at least one of said second and third materials.

13. A method of forming an SRAM device, comprising:
 forming a hard mask layer above a semiconducting substrate;
 depositing a layer of a first spacer material above a plurality of spaced-apart first mandrels positioned above said hard mask layer;
 performing a first anisotropic etching process on said layer of first spacer material to thereby define a plurality of first spacers;
 after forming said plurality of first spacers, forming a second mandrel adjacent each of said plurality of first spacers;
 depositing a layer of a second spacer material above said second mandrels;
 performing a second anisotropic etching process on said layer of second spacer material to thereby define a plurality of second spacers, each of which are positioned adjacent one of said second mandrels;
 after forming said plurality of second spacers, forming a third mandrel adjacent each of said second spacers;
 depositing a layer of a third spacer material above said third mandrels;
 performing a third anisotropic etching process on said layer of third spacer material to thereby define a plurality of third spacers;
 performing at least one process operation to remove said first, second and third mandrels selectively relative to said first, second and third spacers, wherein, after said first, second and third mandrels are removed, said first, second and third spacers define a patterned spacer mask layer;
 performing a first etching process on said hard mask layer through said patterned spacer mask layer to thereby define a patterned hard mask layer; and
 performing a second etching process on said substrate through said patterned hard mask layer to thereby define a plurality of first fins in said substrate, a plurality of second fins in said substrate and a plurality of third fins in said substrate, wherein said first fins have a first width that corresponds approximately to a width of said first spacers, said second fins have a second width that corresponds approximately to a width of said second spacers, and said third fins have a third width that corresponds approximately to a width of said third spacers.

14. The method of claim 13, wherein said first, second and third widths are the same.

15. The method of claim 13, wherein said first, second and third widths are all different from one another.

16. The method of claim 13, wherein two of said first, second and third widths are the same while the other one of said first, second and third widths is different from said two of said first, second and third widths.

17. The method of claim 13, wherein said first, second and third spacers are all comprised of the same material.

18. The method of claim 13, wherein each of said first, second and third spacers are comprised of a different material.

19. The method of claim 13, further comprising removing said patterned spacer mask layer prior to performing said second etching process.

20. A method of forming an SRAM device, comprising:
 forming a hard mask layer above a semiconducting substrate;
 forming a patterned spacer mask layer above the hard mask layer, said patterned spacer mask layer being comprised of a plurality of first spacers, a plurality of second spacers and a plurality of third spacers, wherein each of said first, second, and third spacers are comprised a different material;

performing a first etching process on said hard mask layer through said patterned spacer mask layer to thereby define a patterned hard mask layer;

performing a second etching process on said substrate through said patterned hard mask layer to thereby define a plurality of first fins in said substrate, a plurality of second fins in said substrate and a plurality of third fins in said substrate, wherein said first fins have a first width that corresponds approximately to a width of said first spacers, said second fins have a second width that corresponds approximately to a width of said second spacers, and said third fins have a third width that corresponds approximately to a width of said third spacers.

* * * * *